(12) United States Patent
Granados et al.

(10) Patent No.: US 7,532,037 B1
(45) Date of Patent: May 12, 2009

(54) ENHANCED CML DRIVER CIRCUIT FOR "QUIET-DRIVER" MEASUREMENT ENABLEMENT

(75) Inventors: Axel Aguado Granados, Rochester, MN (US); Benjamin Aaron Fox, Rochester, MN (US); Nathaniel James Gibbs, Rochester, MN (US); Andrew Benson Maki, Rochester, MN (US); Trevor Joseph Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/115,359

(22) Filed: May 5, 2008

(51) Int. Cl.
*H03K 19/094* (2006.01)
(52) U.S. Cl. .............................. 326/115; 326/33; 326/16
(58) Field of Classification Search ................ 326/115, 326/31, 33, 16, 127, 82–83, 86–87; 327/108, 327/109
See application file for complete search history.

(56) References Cited

U.S. PATENT DOCUMENTS

| | | | |
|---|---|---|---|
| 5,600,267 A | 2/1997 | Wong et al. | |
| 6,518,797 B2 | 2/2003 | Yang | |
| 6,559,719 B2 * | 5/2003 | Sakuragi | 330/252 |
| 7,224,189 B1 | 5/2007 | Ziazadeh et al. | |
| 7,385,443 B1 * | 6/2008 | Denison | 330/9 |
| 7,417,461 B2 * | 8/2008 | Aoike | 326/82 |

\* cited by examiner

*Primary Examiner*—James H Cho
(74) *Attorney, Agent, or Firm*—Cahn & Samuels, LLP

(57) ABSTRACT

A method for enhancing a CML driver circuit to allow efficient, and accurate measurement of the magnitude of the voltage domain noise present near a CML driver in an integrated circuit. The disclosed method for enhancing a CML driver circuit to enable quiet driver measurement includes providing a predetermined low impedance path from the power rail of said CML driver circuit via a first node to the output pins of the circuit and providing a predetermined low impedance path from the ground rail of said CML driver circuit via a second node to the output pins of the circuit. The method also includes disabling the current source causing the pull-up termination circuitry to become high impedance, and the logic driving said inputs of the CML circuit to exist in a low state and performing a low impedance measurement of the power rail noise, ground rail noise and the chip noise in the region of the CML driver.

1 Claim, 4 Drawing Sheets

US 7,532,037 B1

ENHANCED CML DRIVER CIRCUIT FOR "QUIET-DRIVER" MEASUREMENT ENABLEMENT

I. FIELD OF THE INVENTION

This invention relates to a method for enhancing a CML driver circuit to allow efficient measurement of chip noise in the region of the CML driver.

II. BACKGROUND OF THE INVENTION

Current Mode Logic (CML) is very popular in high speed link designs, specifically as the final stage of the transmitter's output. During evaluation of CML circuits, it is desired to measure the noise present on the power and ground rails at the circuit to either debug a problem or quantify the magnitude of noise to understand the performance of the CML circuit design.

FIG. 1 illustrates a typical CML differential amplifier used as an off-chip driver in a high speed I/O link. In this design, switchable pull-up resistor networks 110, 111 are used for impedance tuning. Each pull-up resistor network 110, 111 is coupled to ESD protection structures 130, 131 through a T-coil structures 120, 121. The T-coil structures are used to compensate for the capacitance of the ESD protection structures 130, 131. The impedance control pin 140 allows the termination impedance of the circuit to be varied. The bias node 141 allows designation of a particular bias to the circuit.

Traditionally, sense lines are used to measure the noise present on the power and ground rails of the circuit. Sense lines allow a designer or researcher to make measurements in a laboratory; however sense lines suffer a drawback of requiring the addition of C4s and module-to-board connections. Adding C4s and module-to-board connections for this type of application is typically inefficient and ineffective due to the size constraints of the design.

III. SUMMARY OF THE INVENTION

Disclosed are methods, systems and apparatus for efficiently and accurately sensing the magnitude of the voltage domain noise present near a CML driver in an integrated circuit. The disclosed method, system and apparatus for enhancing a CML driver circuit to enable quiet driver measurement include providing a predetermined low impedance path from the power rail of said CML driver circuit via a first node to the output pins of the circuit and providing a predetermined low impedance path from the ground rail of said CML driver circuit via a second node to the output pins of the circuit. The method also features disabling the current source causing the pull-up termination circuitry to become high impedance, and the logic driving said inputs of the CML circuit to exist in a low state and performing a low impedance measurement of the power rail noise, ground rail noise and chip noise in the region of the CML driver.

In the detailed description, references to "one embodiment", "an embodiment", or "in embodiments" mean that the feature being referred to is included in at least one embodiment of the invention. Moreover, separate references to "one embodiment", "an embodiment", or "in embodiments" do not necessarily refer to the same embodiment; however, neither are such embodiments mutually exclusive, unless so stated, and except as will be readily apparent to those skilled in the art. Thus, the invention can include any variety of combinations and/or integrations of the embodiments described herein.

Given the following enabling description of the drawings, the method should become evident to a person of ordinary skill in the art.

IV. BRIEF DESCRIPTION OF THE DRAWING

In order to describe the manner in which the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings.

V. DETAILED DESCRIPTION

Various embodiments are discussed in detail below. While specific implementations of the disclosed technology are discussed, it should be understood that this is done for purposes of illustration. A person skilled in the relevant art will recognize that other components and configurations may be used without departing from the spirit and scope of the invention.

Figure 1:
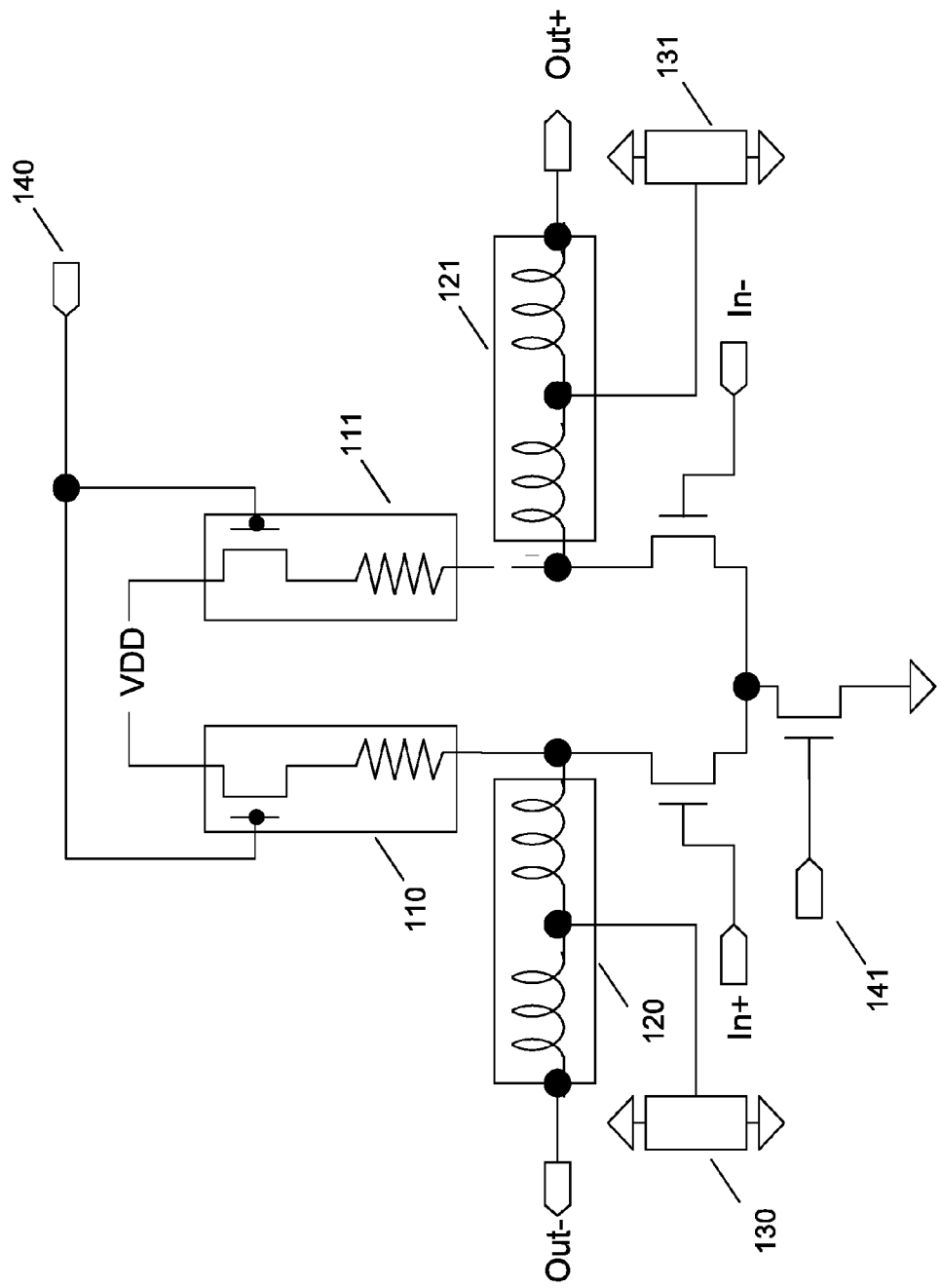
FIG. 1 illustrates a typical CML differential amplifier used as an off-chip driver in a high speed I/O link.
Figure 2:
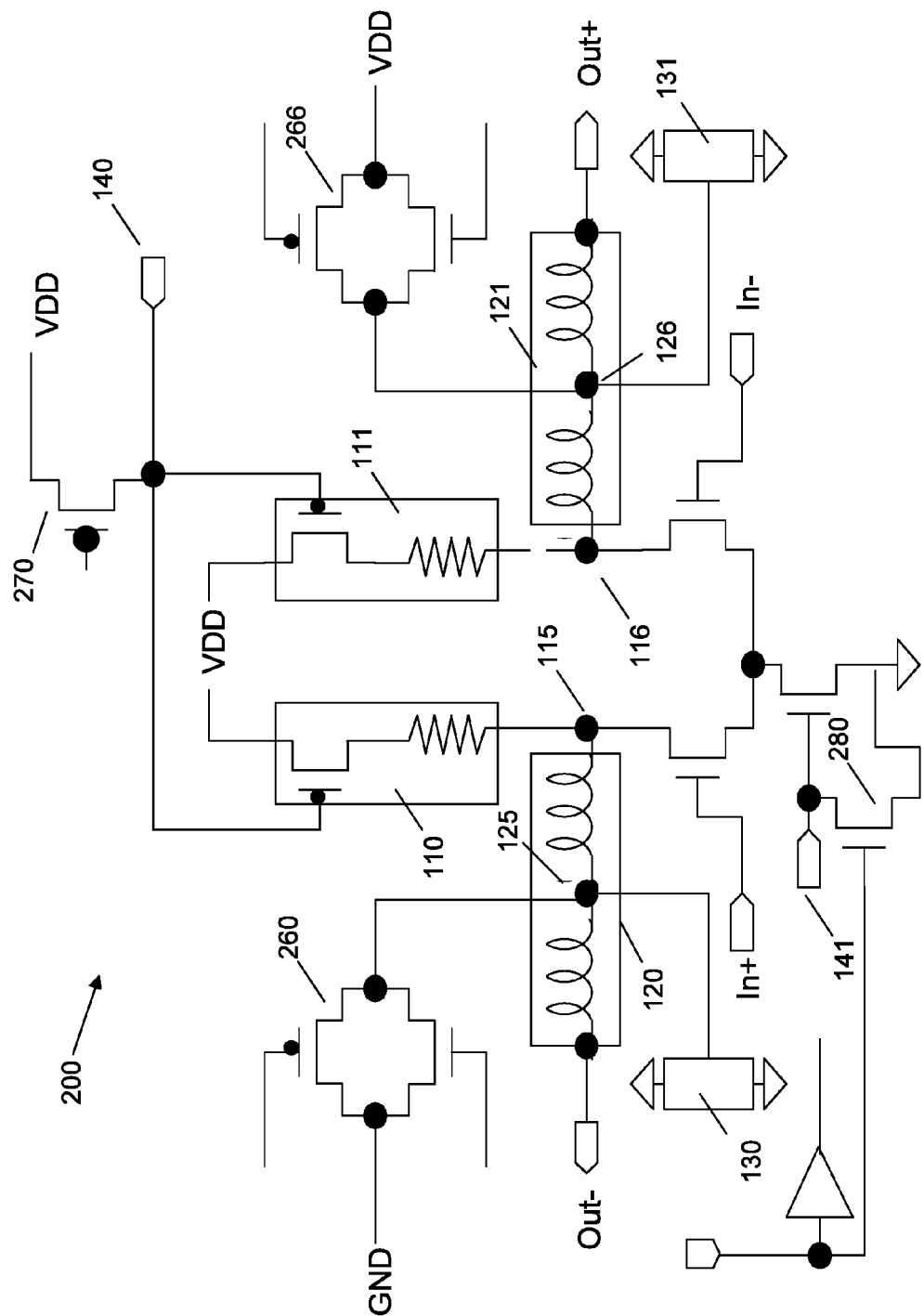
FIG. 2 illustrates an exemplarily embodiment of a modified CML differential amplifier of FIG. 1 enabling accurate and high bandwidth sensing of the power and ground rails of said amplifier.

Referring to the Figures, wherein like elements are denoted by like numbers, FIG. 2 illustrates an exemplarily embodiment of a modified CML differential amplifier of FIG. 1 enabling easy, accurate and high bandwidth operation and low impedance measurements of chip noise in the region of the CML driver.

The CML differential amplifier 200 features a plurality of switchable pull-up resistor networks 110, 111. The pull-up resistor networks 110, 111 are switched in and out of the circuit for impedance tuning. A first T-coil assembly 120 is electrically coupled to a first pull-up resistor 110 via a first node 115. A second T-coil assembly 121 is electrically coupled to a second pull-up resistor 111 network via a second node 116. A first ESD protection assembly 130 is electrically coupled to said first T-coil assembly 120 via a third node 125 and a second ESD protection assembly 131 is electrically coupled to said second T-coil assembly 121 via a fourth node 126, such that each said T-coil assembly 120, 121 provides inductance to compensate for the capacitance of ESD protection assemblies 130, 131.

The first T-coil assembly 121 is also coupled to a first MOS transistor switch assembly 260 through said third node 125. The first MOS transistor switch 260 is coupled to said first T-coil structure 120 through a source or drain depending on transistor configuration coupled to said third node 125. The second pair (opposing) drain/source are coupled to GND through a common node. Each of the gate assemblies are coupled to a digital input. Of the two gate assemblies associated with the two MOS transistor that comprise the first switch assembly 260, one gate is coupled to enable digital input and the second gate is coupled to the enable_b digital input. These digital inputs relate to each other in that they share inverse states. When enable_b is high enable is low. When enable is high enable_b is low.

A second T-coil structure 121 is also coupled to a second MOS transistor switch assembly 266 through the fourth node 126. The second MOS transistor switch 266 is coupled to second T-coil structure 121 through a source or drain coupled to the fourth node 126. The opposing drain/source are coupled to Vdd. Each of the gate assemblies are coupled to a digital input. Of the two gate assemblies associated with the two MOS transistor that comprise the second switch assembly 266, one gate is coupled to enable digital input and the second gate is coupled to the enable_b digital input.

A third MOS transistor 270, functioning as a stand alone switch, is coupled to the impedance control of the pull-up resistor network 140 through a source or drain. The source/drain is coupled to the Vdd and the gate is coupled to a digital input enable_b. A fourth MOS transistor 280, also functioning as a stand alone switch is coupled to GND through a source or drain and to the bias line 141 through the other drain/source. The gate for the fourth MOS transistor is coupled to the enable digital input.

Figure 3:
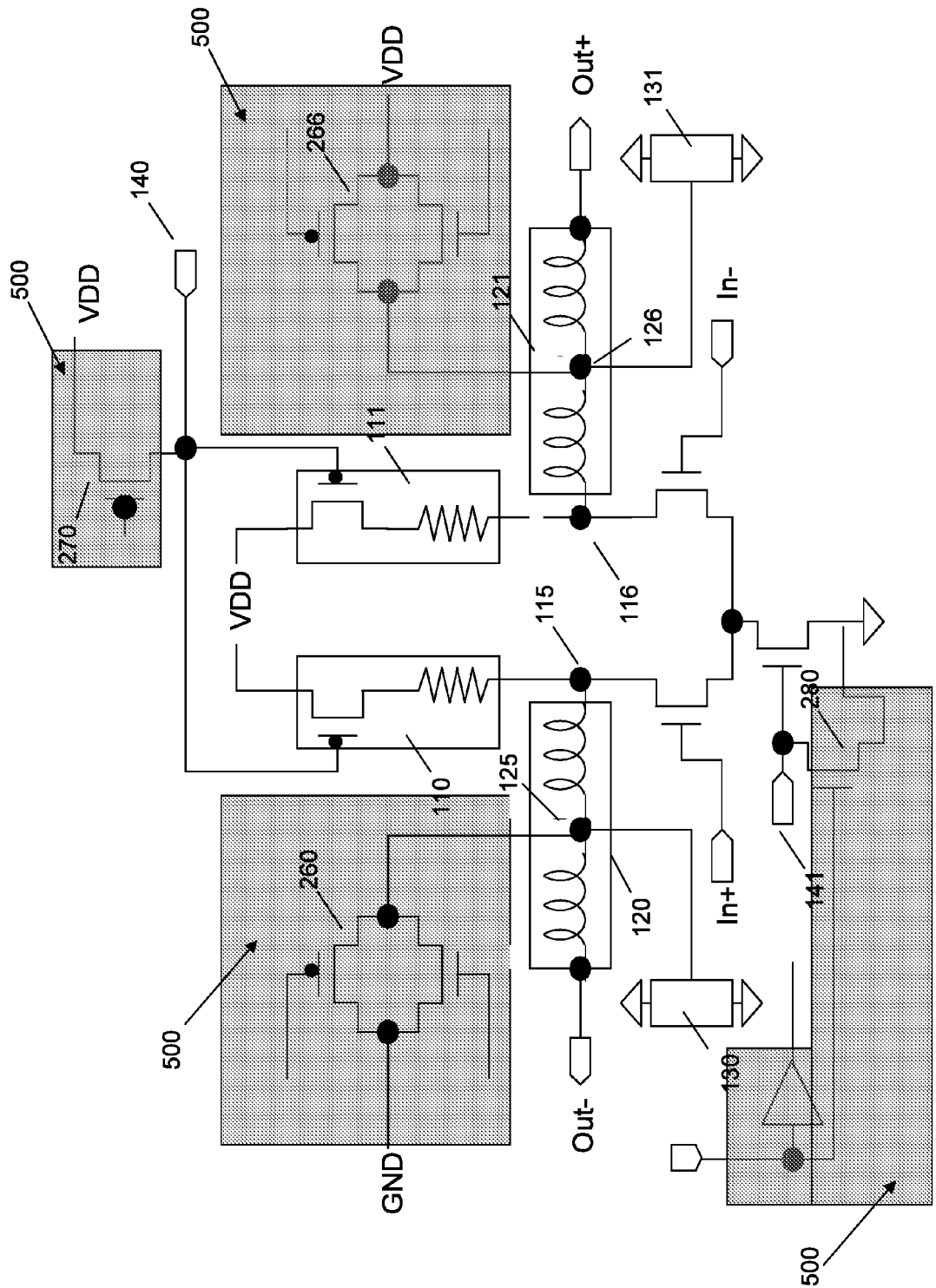
FIG. 3 illustrates an exemplarily embodiment of the modified CML differential amplifier circuit of FIG. 2 in normal operation.

Referring now to FIG. 3 which illustrates the exemplarily embodiment of the modified CML differential amplifier circuit of FIG. 2 in normal operation. In normal operation the enhanced circuit functions as a traditional CML driver circuit. In normal operation the enable digital input is tied to GND. This has the effect of causing the transistor switch assemblies of 260, 266 and the transistors 270, 280 to close or become highly resistive and transmit no current, thus effectively removing the enhancements from the circuit or rendering the enhancements transparent. What comes in the In+ and In− nodes comes out of the Out+ and Out−. The disabled function is illustrated by shaded areas 500. In FIG. 3 the switch assemblies 260, 266 and the transistors 270, 280 are blocked out to indicate their lack of function in the circuit. Thus the signal flow is from In− to Out− and from In+ to Out+.

Figure 4:
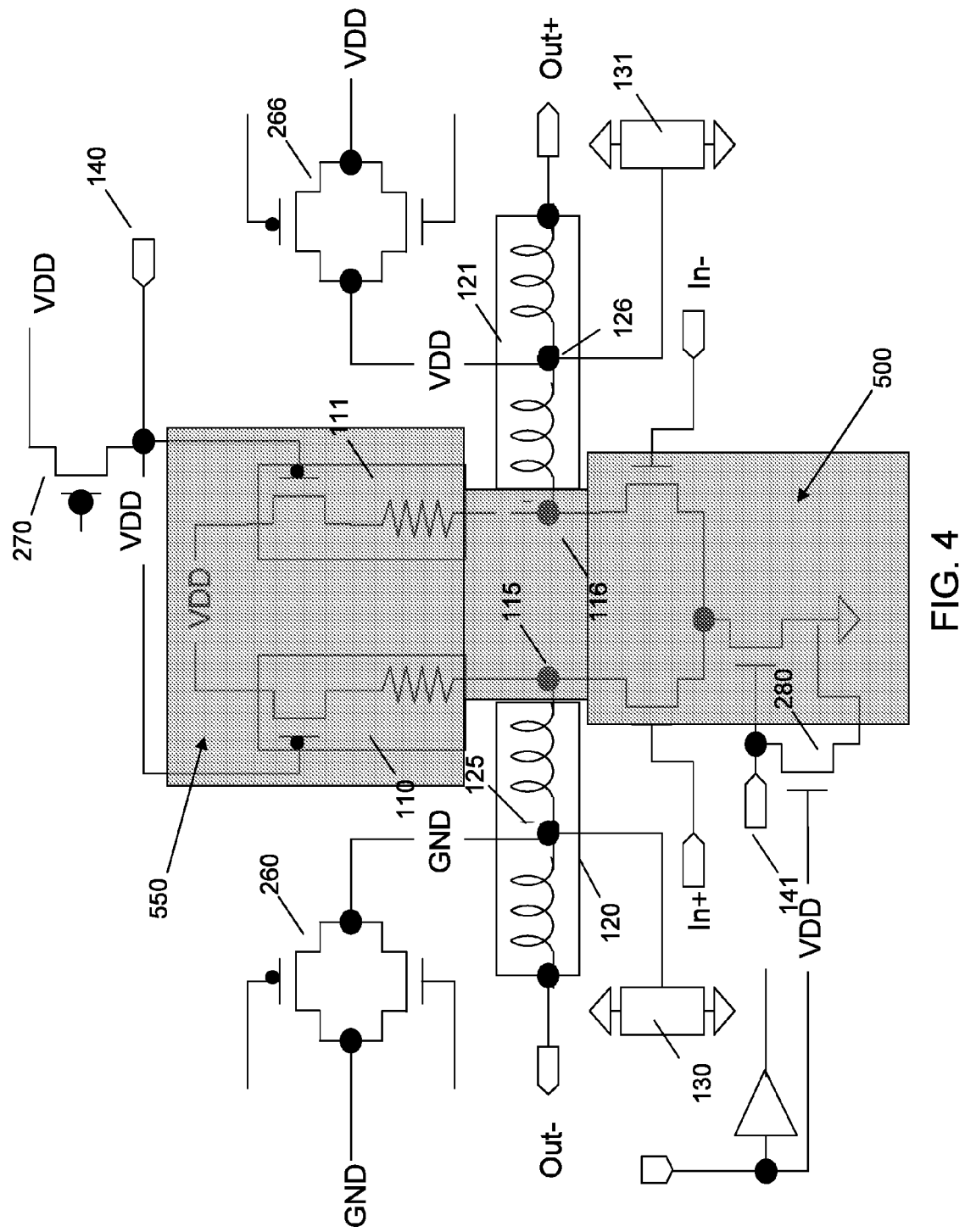
FIG. 4 illustrates an exemplarily embodiment of the modified CML differential amplifier circuit of FIG. 2 operating in a mode to allow low impedance measurement of the chip noise in the region of the CML driver.

FIG. 4 illustrates the exemplarily embodiment of the modified CML differential amplifier circuit of FIG. 2 operating in a mode to allow low impedance measurement of the chip noise in the region of the CML driver. When the enable is asserted HIGH, enable_b simultaneously is asserted LOW activating the transistor switch assemblies and disabling the current source. This is illustrated by shaded areas 550. The pull-up termination resistors are also disabled and Vdd is connected to the Out+ output and GND is connected to the Out− output.

These enhancements provide a predetermined low impedance path from the power of said CML driver circuit via a first node to one output pin of the circuit. Also these enhancements provide a predetermined low impedance path from the ground rail of said CML driver circuit via a second node to the other output pin of the circuit and disables the current source causing the pull-up termination circuitry to become high impedance, and the logic driving said inputs of the CML circuit to exist in a low state.

In yet another example embodiment, the invention resides in a system for enhancing a CML driver circuit to enable quiet driver measurement employing switch assemblies configured to provide a predetermined low impedance path from the power rail of said CML driver circuit via a first node to one output pin of the circuit and switch assemblies configured to provide a predetermined low impedance path from the ground rail of said CML driver circuit via a second node to other output pin of the circuit. The system also features switch assemblies for disabling the current source causing the pull-up termination circuitry to become high impedance, and the logic driving said inputs of the CML circuit to exist in a low state wherein said enhancement facilitates the performance of a low impedance measurements of chip noise in the region of the CML driver.

The invention can take the form of an entirely hardware embodiment, an embodiment containing both hardware and software elements. In a preferred embodiment, the invention can take form of a hardware element coupled with digital controls required to switch the modes of the circuit.

In yet another example embodiment the invention resides in a computer program product comprising computer usable medium having a computer-usable program code for enhancing a CML driver circuit for to enable quiet drive measurement having computer usable program code for providing a predetermined low impedance path from the power rail of said CML driver circuit via a first node to the output pins of the circuit and computer usable program code for providing a predetermined low impedance path from the ground rail of said CML driver circuit via a second node to the output pins of the circuit. The computer program product also has computer usable program code for disabling the current source causing the pull-up termination circuitry to become high impedance, and the logic driving said inputs of the CML circuit to exist in a low state wherein said enhancement facilitates the performance of a low impedance measurements of chip noise in the region of the CML driver.

The disclosed invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Computer program code for carrying out operations of the present invention may be written in a variety of computer programming languages. The program code may be executed entirely on at least one computing device, as a stand-alone software package, or it may be executed partly on one computing device and partly on a remote computer. In the latter scenario, the remote computer may be connected directly to the one computing device via a LAN or a WAN (for example, Intranet), or the connection may be made indirectly through an external computer (for example, through the Internet, a secure network, a sneaker net, or some combination of these).

It will be understood that each block of the flowchart illustrations and block diagrams and combinations of those blocks can be implemented by computer program instructions and/or means. These computer program instructions may be provided to a processor of at least one general purpose computer, special purpose computer(s), or other programmable data processing apparatus to produce a machine, such that the instructions, which execute via the processor of the computer or other programmable data processing apparatus, create means for implementing the functions specified in the flowcharts or block diagrams.

The exemplary and alternative embodiments described above may be combined in a variety of ways with each other. Furthermore, the steps and number of the various steps illustrated in the figures may be adjusted from that shown.

Although the present invention has been described in terms of particular exemplary and alternative embodiments, it is not limited to those embodiments. Alternative embodiments, examples, and modifications which would still be encompassed by the invention may be made by those skilled in the art, particularly in light of the foregoing teachings.

The invention claimed is:

1. A method of enhancing a CML driver circuit to enable local voltage and ground domain sensing comprising:
    providing a predetermined low impedance path from the power rail of said CML driver circuit via a first node to the output pins of the circuit;
    providing a predetermined low impedance path from the ground rail of said CML driver circuit via a second node to the output pins of the circuit;
    disabling the current source causing the pull-up termination circuitry to become high impedance, and the logic driving said inputs of the CML circuit to exist in a low state;
    wherein said enhanced circuit facilitates the performance of a low impedance measurement of the power rail noise, low impedance measure of the ground rail noise and low impedance measure of the chip noise in the region of the CML driver.

* * * * *